United States Patent
Kohama

(10) Patent No.: US 8,797,697 B2
(45) Date of Patent: Aug. 5, 2014

(54) HIGH FREQUENCY INTEGRATED CIRCUIT

(75) Inventor: Kazumasa Kohama, Kanagawa (JP)

(73) Assignee: Sony Corporation, Tokyo (JP)

( * ) Notice: Subject to any disclaimer, the term of this patent is extended or adjusted under 35 U.S.C. 154(b) by 214 days.

(21) Appl. No.: 11/663,966

(22) PCT Filed: Oct. 12, 2005

(86) PCT No.: PCT/JP2005/018784
§ 371 (c)(1),
(2), (4) Date: Mar. 28, 2007

(87) PCT Pub. No.: WO2006/041087
PCT Pub. Date: Apr. 20, 2006

(65) Prior Publication Data
US 2008/0043388 A1 Feb. 21, 2008

(30) Foreign Application Priority Data

Oct. 13, 2004 (JP) ................. 2004-298955

(51) Int. Cl.
*H02H 9/00* (2006.01)
(52) U.S. Cl.
USPC .......................................... 361/56
(58) Field of Classification Search
USPC .......................... 361/56, 91.1, 111
See application file for complete search history.

(56) References Cited

U.S. PATENT DOCUMENTS

| | | | | |
|---|---|---|---|---|
| 5,615,073 A | * | 3/1997 | Fried et al. ........................ | 361/56 |
| 5,751,525 A | | 5/1998 | Olney | |
| 5,774,318 A | * | 6/1998 | McClure et al. ................ | 361/56 |
| 6,459,553 B1 | | 10/2002 | Drapkin et al. | |
| 6,661,276 B1 | * | 12/2003 | Chang ........................... | 327/427 |
| 7,183,592 B2 | * | 2/2007 | Hwang ........................ | 257/194 |
| 2002/0064962 A1 | * | 5/2002 | Wang et al. .................... | 438/712 |
| 2002/0177261 A1 | * | 11/2002 | Song ............................ | 438/167 |

FOREIGN PATENT DOCUMENTS

| | | |
|---|---|---|
| EP | 0 789 451 A1 | 8/1997 |
| JP | 57-162466 A | 10/1982 |
| JP | 05-136360 | 6/1993 |
| JP | 06-013862 | 1/1994 |
| JP | 11-154733 | 6/1999 |
| JP | 2000-067323 | 3/2000 |
| JP | 2000-510653 | 8/2000 |
| WO | WO 00/67323 | 11/2000 |

OTHER PUBLICATIONS

Boylestad et al., Electronic Devices and Circuit Theory, 2002, Prentice Hall, Eight Edition, pp. 263-281.*
Kohama K et al., "An Antenna Switch MMIC for GSM/UMTS Handsets Using E/D-Mode JPHEMT Technology" Jun. 12, 2005, 2005 IEEE Radio Frequency Integrated Circuits (RFIC) Symposium (IEEE Cat No. 05CH37652) IEEE Piscataway, NJ pp. 509-512 XP002625915 ISBN: 0-7803-8983-2.
Extended European Search Report issued Mar. 14, 2011 for corresponding European Application No. 05 79 3641.

* cited by examiner

*Primary Examiner* — Rexford Barnie
*Assistant Examiner* — Tien Mai
(74) *Attorney, Agent, or Firm* — Rader, Fishman & Grauer PLLC

(57) ABSTRACT

A high frequency integrated circuit equipped with an electrostatic protection device provided with a field effect transistor as an electrostatic protection device at the input and output of a high frequency integrated circuit, having excellent high frequency characteristics, and making an ESD withstand voltage large, having a high frequency circuit 11 having input/output terminals and an enhancement type field effect transistor 13 formed on a compound semiconductor substrate and provided in said high frequency circuit, having one terminal of the input/output terminals connected to the input/output terminals of the high frequency circuit, having the other terminal connected to a first reference potential, and having a gate connected via a resistor 14 to a second reference potential, and making an impedance of the field effect transistor 13 low for ESD protection when noise or a high voltage pulse is applied from the input/output terminals.

8 Claims, 4 Drawing Sheets

HIGH FREQUENCY INTEGRATED CIRCUIT

TECHNICAL FIELD

The present invention relates to a high frequency integrated circuit equipped with an electrostatic protection device of an MMIC (monolith microwave integrated circuit), and more particularly, relates to electrostatic discharge (ESD) protection by providing an electrostatic protection device at an input or output portion of a high frequency MMIC.

BACKGROUND ART

In a cellular phone etc., communication is performed by using high frequency signals in the 800 MHz to 2.3 GHz bandwidth. This frequency is relatively high; therefore, in selecting a device using a power amplifier (PA) for amplifying a transmission power, a low noise amplifier (LNA) for amplifying a reception signal, a switch (SW) for switching signals etc., often the high frequency characteristic is very important and a compound semiconductor such as GaAs is used in place of the usually used Si semiconductor.

A high frequency integrated circuit using a GaAs or other compound semiconductor generally has excellent high frequency characteristics, but often is very weak against the ESD (electrostatic discharge). One of the reasons for this is that each device used is vulnerable to ESD or other noise due to the improvement of the high frequency characteristics. Further, when introducing a protection device, since the handled frequency is high, the adverse influence due to the parasitic capacitance cannot be avoided. Sufficient countermeasures are often not taken.

FIG. 4A shows an example of the circuit configuration of an ESD protection circuit 40 equipped with a conventional ESD protection device. Between an I/O (input/output) terminal 42 and a GND (ground), a diode 43 is connected for countering ESD. In the case of a positive DC (direct current) bias or an RF signal having an RF amplitude of a forward threshold voltage (Vf) or less of the diode 43, this diode 43 appears to have a relatively high impedance and does not exert any influence upon the circuit characteristics. On the other hand, when noise having a voltage amplitude like ESD is applied to the I/O (input/output) terminal 42, it exceeds a breakdown voltage (Vb) in a reverse direction of the protection diode 43, the noise is pulled into the GND, and damage to the internal portion of the circuit (high frequency circuit 41) can be avoided.

FIG. 4B shows a voltage-current characteristic of the diode. The abscissa indicates a voltage applied to the diode 43, and the ordinate indicates a value of current flowing in this diode 43. As apparent from this graph, when voltage is applied in the forward direction, the current flows from Vf (forward directional threshold voltage), while when the voltage is applied in the reverse direction, almost no current flows up to Vb (breakdown voltage). However, when the application voltage in the reverse direction exceeds Vb, the current begins to abruptly flow. As a result, a resistance of the diode 43 ($\Delta V/\Delta I$) becomes small.

When forming a protection diode on an Si substrate, a positive pole or negative pole of the diode can be obtained at a substrate bulk side having a low resistance. On the other hand, when forming the diode 43 as in FIG. 4A on a GaAs substrate, since the GaAs substrate itself has a high resistance, it is necessary to obtain both of the positive pole and negative pole of the diode at the substrate surface, the structure becomes complex, and obtaining the ability as a protection device becomes difficult. Further, in order to configure the diode, use is made of a PN junction, Schottky junction, etc., but basically this junction is not strong against ESD etc., so it is difficult to obtain a high performance ESD device.

Further, this junction portion has a large parasitic capacitance; therefore, it is apt to exert an adverse influence upon the high frequency characteristic.

A high frequency integrated circuit 50 of a conventional example not having a protection device is shown in FIG. 5. In FIG. 5, a drain of a DFET1C (depletion type field effect transistor) 53 is connected to an input/output terminal I/O 52 of a high frequency circuit 51, its source is connected to one terminal of a capacitor C50 (55), and the other terminal of the capacitor C50 is connected to the GND (ground). Further, the gate is connected via a resistor 54 to a control terminal (CTL3).

Here, the resistor configuring the DC bias of the DFET1C (53) is omitted. Only the circuit relating to the high frequency (AC) signal is shown.

A reference voltage is applied from the CTL3 via the resistor 54 to the gate of the DFET1C (53) to turn it ON/OFF and make it function as a switch.

When applying a predetermined voltage to this CTL3 terminal and turning the DFET1C (53) ON, even if a high frequency signal is input from the I/O input terminal 52, current flows via the drain and source of the DFET1C and the capacitor C50, and a high frequency signal is not input to the high frequency circuit 51.

Next, the DFET1C is turned OFF and the input signal is supplied to the high frequency circuit 51. In this state, assuming that for example a high voltage noise or high voltage pulse is applied to the I/O input terminal 52, a D field effect transistor (DFET1C) 53 is usually in the OFF state. Since the output impedance of the DFEI1C is high, a pulse current cannot rapidly be sent to the capacitor C50 and is input to the input or output of the high frequency circuit 51. As a result, internal devices of the high frequency circuit 51 are broken.

An example of providing a protection device at the input terminal or output terminal of a high frequency circuit 61 for improving the circuit of FIG. 5 is shown next. FIG. 6 shows another conventional example obtained by adding a protection diode to the high frequency integrated circuit 50 shown in FIG. 5. In FIG. 6, the drain of a D field effect transistor (DFET1D: Depletion type field effect transistor) 63 is connected to an input/output terminal I/O 62 of the high frequency circuit 61, its source is connected to one terminal of a capacitor C60 (67), and the other terminal of the capacitor C60 is connected to the GND. The source is further connected to a cathode of a diode 65, and an anode is connected to the anode of a diode 66. The cathode of the diode 66 is connected to the GND. Further, the gate of the D field effect transistor 63 is connected via a resistor 64 to a control 5 (CTL5).

The reference voltage is applied from the CTL5 via the resistor 64 to the gate of the D field effect transistor 63.

Between the source of the D field effect transistor 63 and the GND, a protection device using two diodes 65 and 66, having anodes commonly connected, having cathodes arranged at both ends, having one cathode connected to the source of the D field effect transistor 1D63, and having the other cathode connected to the GND is provided. The electrical input/output characteristics of this protection device are that a current does not flow and the resistance becomes high when the input voltage is smaller than an absolute value of the voltages of Vb+Vf in both of the forward direction and the reverse direction and that the current abruptly flows and the resistance becomes low when the input voltage is larger than the absolute value of Vb+Vf.

When high voltage noise or a high voltage pulse from the input/output terminal I/O (62) is input, since the D field effect transistor 1D63 is in a floating state, the drain and the source become conductive. When the input voltage becomes equal to the added withstand voltages of the diodes 65 and 66 or more, as explained above, the diodes 65 and 66 break down, and the combined resistance value thereof changes from a high resistance to a low resistance. As a result, charges are discharged via the diodes 65 and 66 forming a low resistance current passage to the GND, and noise or a high voltage pulse is no longer applied to the high frequency circuit 61.

However, in the example of this high frequency integrated circuit equipped with a protection diode, in the same way as FIG. 4A, when the diodes 65 and 66 are formed on the GaAs substrate, since the GaAs substrate itself has a high resistance, it is necessary to obtain both of the positive poles and negative poles of the diodes at the substrate surface, the structure becomes complex, and it is difficult to draw out the capability as a protection device. Further, in order to configure the diodes, use is made of a PN junction, Schottky junction, etc., but basically this junction is not strong against ESD etc., so it is difficult to obtain a high performance ESD device.

Further, this junction portion has a large parasitic capacitance, therefore is apt to exert an adverse influence upon the high frequency characteristics.

Patent Document 1: Japanese Patent Publication (A) No. 6-13862
Patent Document 2: Japanese Patent Publication (A1) No. 2000-510653

DISCLOSURE OF THE INVENTION

Problems to be Solved by the Invention

As explained before, in general, a GaAs high frequency integrated circuit is fragile in terms of ESD and measures against this are difficult. On the other hand, GaAs high frequency integrated circuits have begun to be frequently used for consumer applications such as mobile phones, therefore realization of a GaAs high frequency integrated circuit having not only excellent high frequency performance, but also a large ESD withstand voltage is desired.

The present invention was made in consideration of the above problem and it is desired to provide a high frequency circuit equipped with a protection circuit achieving both an excellent high frequency characteristic and a high ESD withstand voltage by using a device having a high ESD protection capability.

Means for Solving the Problem

The present invention has a high frequency circuit having input/output terminals (I/O (12)) and an enhancement type field effect transistor having at least a portion formed integrally with the high frequency circuit on a compound semiconductor substrate, having one terminal (drain) of the input/output terminals connected to the input/output terminals of the high frequency circuit, having the other terminal (source) connected to a first reference potential (power supply or ground), and having a gate connected via a resistor to a second reference potential (ground).

The present invention has a high frequency circuit having input/output terminals; a depletion type field effect transistor having at least a portion formed integrally with the high frequency circuit on a compound semiconductor substrate, having one terminal of the first input/output terminals connected to the input/output terminal, and having a gate connected via a first resistor to a second reference potential; an enhancement type field effect transistor formed on the compound semiconductor substrate, provided in the high frequency circuit, having one terminal of second input/output terminals connected to the other terminal of the first input/output terminals of the depletion type field effect transistor, having the other terminal of the second input/output terminals connected to the first reference potential, and having a gate connected via a second resistor to the first reference potential; and a first capacitor connected between one terminal of the second input/output terminals of the enhancement type field effect transistor and the first reference potential.

The present invention has an external terminal; a high frequency circuit having input/output terminals; a first capacitor connected between the external terminal and the input/output terminals of the high frequency circuit; and an enhancement type field effect transistor formed on a compound semiconductor substrate and provided in the high frequency circuit, having one terminal of the input/output terminals connected to the external terminal, having the other terminal connected between input and output terminals of the high frequency circuit, and having a gate connected via a resistor to a first reference potential.

The present invention is provided with an enhancement type field effect transistor (field effect transistor) at the input/output terminals of a high frequency circuit. When noise or a high voltage pulse is input from the outside, the enhancement type field effect transistor is made to perform a breakdown operation and the impedance thereof is lowered to thereby discharge the noise or high voltage pulse.

Effects of the Invention

A high frequency circuit equipped with an electrostatic protection device of the present invention can be produced by addition of the minimum number of steps in a process of formation on GaAs since, when using an E field effect transistor (enhancement type field effect transistor) as a protection device, it has the same or almost the same structure as that of a D field effect transistor (depletion type field effect transistor) or the E field effect transistor used in the high frequency circuit. Further, as in a diode type protection device, ESD and other noise does not pass through the junction, therefore the capability and withstand voltage of the protection device itself are excellent. Further, the device inherently has the same structure as the field effect transistors used in the high frequency circuit, so the parasitic capacitance is small and the adverse influence exerted upon the original circuit is small.

DESCRIPTION OF NOTATIONS

The following reference and numerals are used in this specification 10, 20, 30, 40, 60 . . . refer to high frequency integrated circuits equipped with electrostatic protection devices; 11, 21, 31, 41, 51, 61 . . . refer to high frequency circuits; 12, 22, 42, 52, 62 . . . refer to input/output terminals (external terminals); 13, 25, 24 . . . refer to E field effect transistors (enhancement type field effect transistors); 23, 53, 63 . . . refer to D field effect transistors (depletion type field effect transistors); 21, 31, 54, 64 . . . refer to resistors; 27, 33, 55, 67 . . . refer to capacitors; and 43, 65, 66 . . . refer to diodes.

Best Mode for Carrying out the Invention

Figure 1A:
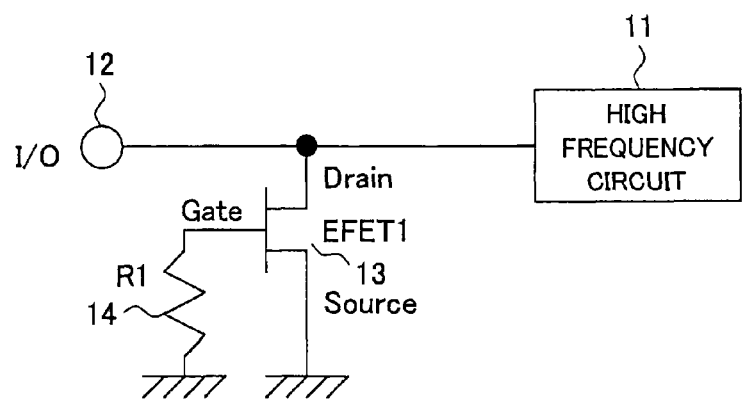
FIG. 1A is a circuit diagram showing an overall circuit configuration of a high frequency integrated circuit equipped with an electrostatic protection device of the present invention.

FIG. 1A shows an embodiment of a high frequency integrated circuit equipped with an electrostatic protection device (circuit). In FIG. 1A, input/output terminals I/O 12 are connected to a high frequency circuit 11 and connected to the drain of an E field effect transistor (enhancement type field effect transistor) EFET1 (13). The source is connected to the GND (ground), and the gate is connected via a resistor R1 (14) to the GND.

This E field effect transistor (EFET1) 13 is formed on the same substrate as the devices of the high frequency circuit 11, for example, a field effect transistor of an input RF amplifier, MIX etc., and a transmission field effect transistor.

Figure 1B:
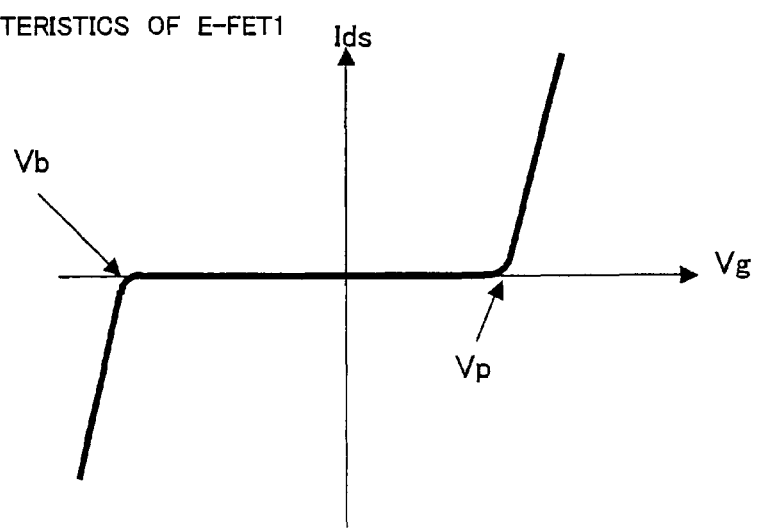
FIG. 1B shows an I-V characteristic of the field effect transistor in FIG. 1A.

When the gate of the E field effect transistor 13 is 0V, the electrical characteristic of the source grounded E field effect transistor is shown in FIG. 1B. The abscissa indicates Vg (gate/source voltage), and the ordinate indicates a drain current Ids. When Vg is Vp (pinch off voltage) or less, current does not flow, so the impedance is high, while when Vg becomes Vp or more, the drain current Ids begins to flow and, as a result, the impedance becomes low.

On the other hand, when a negative voltage is applied to Vds and the voltage is smaller than the breakdown voltage (Vb), the drain current does not flow, and a high impedance state is exhibited. However, when the voltage becomes a negative voltage larger than the absolute value of Vb, the drain current Ids begins to abruptly flow and the impedance becomes low.

The E field effect transistor 13 is an enhancement type, and its gate is biased via the resistor R1 (14) to GND, therefore it becomes in the OFF state. For this reason, when the I/O terminals 12 are biased positive or when an RF signal having a small amplitude is input, the E field effect transistor (EFPT1) 13 itself appears to have a high impedance.

On the other hand, when noise having a large voltage amplitude such as ESD enters, this noise level exceeds the withstand voltage of the E field effect transistor 13, the E field effect transistor 13 exhibits a low impedance state, and the noise is pulled into the GND, so the inside of the high frequency circuit 11 is not damaged. When an E field effect transistor is used as the protection device, since this E field effect transistor 13 has the same or almost the same structure as that of the D field effect transistor or E field effect transistor used in the high frequency circuit 11, it can be prepared by the addition of the minimum number of steps in the process of formation on the GaAs. Further, as in a diode type protection device, ESD such as other noise does not pass through the junction, therefore the capability and withstand voltage of the protection device itself are excellent. Further, the device inherently has the same structure as the field effect transistors used in the high frequency circuit, so the parasitic capacitance is small and the adverse influence exerted upon the original circuit is small.

The explanation was given hitherto of the input terminal side of the high frequency circuit 11, but it can be used in the same way also on the output terminal side. Further, the enhancement type field effect transistors and the depletion field effect transistors can be configured by MESFETs, gate junction type FETs, HEMTs, etc.

Figure 2:
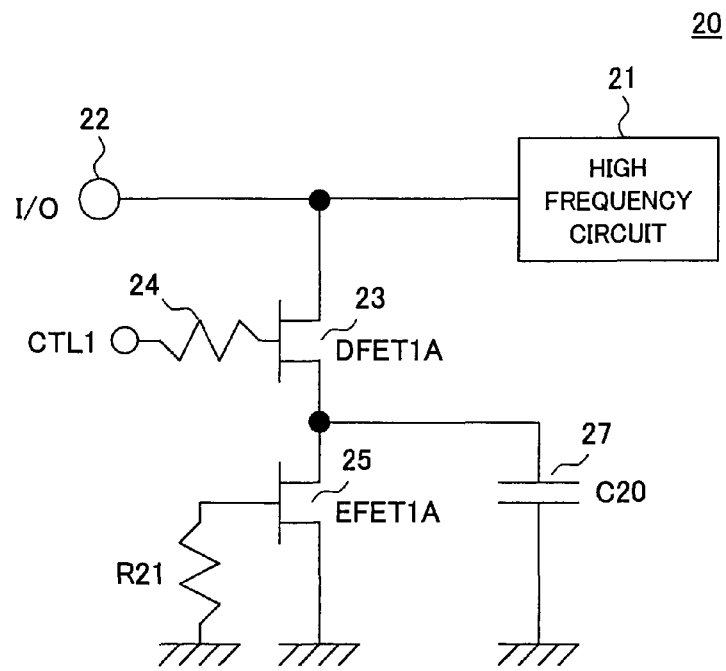
FIG. 2 is a circuit diagram showing an overall circuit configuration of a high frequency integrated circuit equipped with an electrostatic protection device of the present invention.

FIG. 2 shows another embodiment of a high frequency integrated circuit 20 equipped with an electrostatic protection device. In FIG. 2, the drain of a D field effect transistor (DFET1A: depletion type field effect transistor) 23 is connected to input/output terminals I/O 22 of the high frequency circuit 21, its gate is connected to one terminal of a resistor 24, and the other terminal is connected to a control terminal (CTL1). Further, the source is connected to the drain of an E field effect transistor (EFET1A: enhancement type field effect transistor) 25, its source is connected to the GND, and also the gate is connected via a resistor R1 (26) to the GND. The drain of the E field effect transistor 25 is connected to one terminal of a capacitor C20 (27), and the other terminal is connected to the GND.

This E field effect transistor 25 is formed on the same substrate as the devices of the high frequency circuit 21, for example the field effect transistor of the reception use RF amplifier, MIX etc., and the transmission use field effect transistor.

Here, the DC bias of the D field effect transistor 23 is omitted. Only the high frequency circuit is shown.

The D field effect transistor 23 is a signal switching use switch transistor turning ON/OFF by applying the control signal to the CTL1. Further, by the high frequency bypass capacitor C20 (27) and the E field effect transistor 25, the D field effect transistor 23 is isolated from the GND potential in terms of DC, and the D field effect transistor 23 is set at an appropriate bias.

When the control signal (voltage) is supplied to the gate of the D field effect transistor 25 via a resistor R21, the D field effect transistor 23 becomes an ON operation state, and the high frequency signal input from the input/output terminals I/O 22 passes through the drain and the source of the D field effect transistor 23 and flows to the ground via the capacitor C20(27). As a result, the input high frequency signal is not input to the high frequency circuit 21. Namely, when the switching transistor constituted by the D field effect transistor 23 as is ON, this high frequency integrated circuit 20 is in the OFF state, and no signal is input to the high frequency circuit 21.

Next, an explanation will be given of the operation when high voltage noise or a high voltage pulse is input from the input/output terminals I/O 22 when a signal is input to the high frequency circuit 21 in a case where the D field effect transistor 23 of the switching transistor is in the OFF state and the high frequency integrated circuit 20 is in the ON state.

Namely, when high voltage noise or a high voltage pulse is input from the outside via the input/output terminal I/O 22 when the high frequency circuit 21 is in the operation state, the gate of the D field effect transistor 23 becomes a floating state in the state where the control voltage is not applied from the CTL1, but due to the conduction in the state where a high voltage is applied to the drain, a high voltage is applied to the E field effect transistor 25. When this application voltage is the withstand voltage of the E field effect transistor 25 or more, that is, when it becomes the breakdown voltage or more, the resistance between the drain and the source abruptly becomes small, and the charges (current) generated by the high voltage noise or high voltage pulse input from the input/output terminal I/O 22 are pulled into the GND via this E field effect transistor 25.

As a result, high voltage noise or a high voltage pulse does not flow in the high frequency circuit 21, but flows to the GND via the D field effect transistor 23 for the switching transistor and the E field effect transistor 25 of the electrostatic protection transistor. Accordingly, the active devices of the transistors and the passive devices of the capacitors etc. provided in the high frequency circuit 21 are not broken.

In addition, when the usual input signal is input from the input/output terminals I/O 22, the D field effect transistor 23 is in the OFF state and the E field effect transistor 25 of the protection device is in the OFF (not breakdown) state, therefore the impedance is relatively higher than a conventional protection diode, so frequency characteristics better than a conventional high frequency integrated circuit using a diode as a protection device can be maintained without degrading the high frequency characteristics on the input side of the high frequency circuit 21.

The explanation was given hitherto of the input terminal side of the high frequency circuit 21, but the present invention can be applied in the same way also to the output terminal side. Further, the enhancement type field effect transistors and the depletion type field effect transistors can be configured by MESFETs, gate junction type FETs, HEMTs, etc.

Figure 3:
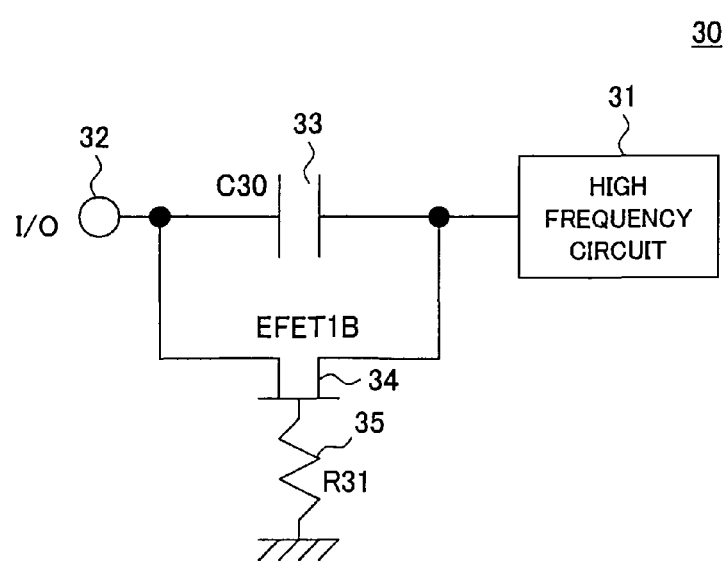
FIG. 3 is a circuit diagram showing an overall circuit configuration of a high frequency integrated circuit equipped with an electrostatic protection device of the present invention.
Figure 4A:
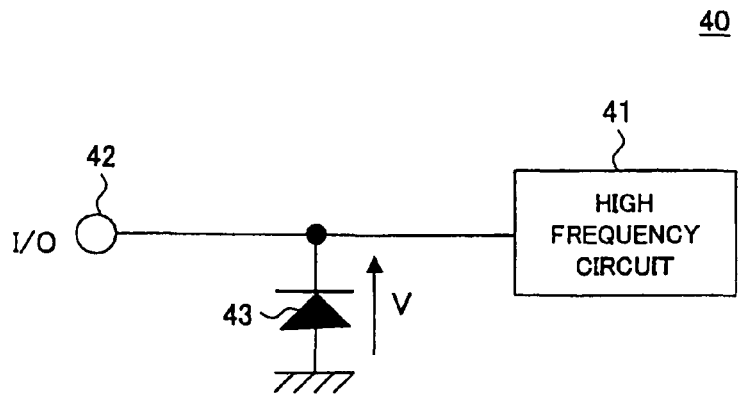
FIG. 4A is a circuit diagram, showing an overall circuit configuration of a high frequency integrated circuit equipped with an electrostatic protection device using a protection diode of a conventional example.
Figure 4B:
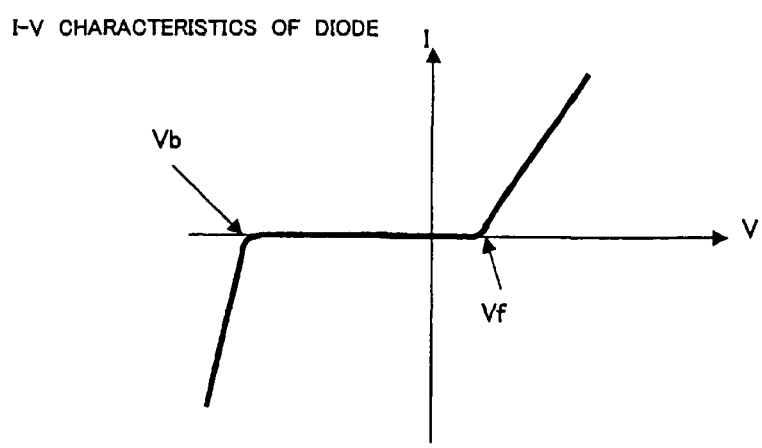
FIG. 4B is a conventional I-V characteristic of the diode shown in FIG. 4A.

FIG. 3 shows another embodiment of a high frequency integrated circuit 30 using an EFET1B (34) as the protection device. In FIG. 3, input/output terminals I/O 32 are connected to one terminal of a capacitor C30 (33), and the other terminal of this capacitor C30 (33) is connected to the input or output terminal of a high frequency circuit 31. Further, the source (or drain) of an E field effect transistor (EFET1B) 34 is connected to the input/output terminal I/O 32, and the drain (or source) is connected to the other terminal of the capacitor C30 (33). Further, the gate is connected via a resistor R31 (35) to the GND.

This E field effect transistor 34 is formed on the same substrate as the devices of the high frequency circuit 31, for example, the field effect transistor of the reception RF amplifier, MIX etc., and the transmission use field effect transistor.

The capacitor C30 (33) connected between the input/output terminals I/O 32 and the input/output of the high frequency circuit 31 functions for example to isolate the high frequency circuit 31 inside the integrated circuit and the bias on the outside of the I/O terminal (32) (for example the outside of the I/O (32) is biased to the GND). Usually, a capacitance formed on the GaAs is weak against ESD. At the time of the ESD input, this capacitor C30 (33) is often broken before the insides are broken. On the other hand, in this example, the E field effect transistor 34 is connected in parallel to the capacitor C30, and its gate terminal is biased to the GND by a resistor R31(35), therefore, the E field effect transistor 34 is held in its OFF state, and the high frequency circuit (31) side can apply an appropriate bias.

When the high frequency signal is input from the input/output terminals I/O 32 in the usual operation, it is input to the high frequency circuit 31 via the capacitor C30 (33). The input/output impedance at the OFF time of the protection device constituted by this E field effect transistor 34 is high and the parasitic capacitance is small, therefore the frequency characteristics of the input or output of the high frequency circuit 31 are determined by the capacitance value of the capacitor C30 (33).

Next, when high voltage noise or a high voltage pulse is input from the I/O terminals 32, and the voltage applied to the E field effect transistor 34 becomes as high as the breakdown voltage or more, a resistance between the source and drain becomes low; therefore, the high voltage noise or high voltage pulse does not pass through the capacitor C30 (33), but passes through the E field effect transistor 34.

For this reason, the breakdown of the capacitor C30 (33) can be prevented. The ESD is partially reflected at the portion of this capacitor C30 (33) and E field effect transistor 34. Further, countermeasures are taken inside the high frequency circuit (31). Therefore, ESD breakdown can be prevented.

The explanation was given hitherto of the input terminal side of the high frequency circuit 31, but the present invention can be applied in the same way also to the output terminal side. Further, the enhancement type field effect transistors and the depletion type field effect transistors can be configured by MESFETs, gate junction type FETs, HEMTs, etc.

Further, as another embodiment, in FIG. 3, for example an ESD protection circuit shown in FIG. 1A or FIG. 2 is provided between the capacitor C30 (33) and the high frequency circuit 31, so not only the capacitor C30 (33), but also the above high frequency circuit 31 can be further protected.

In this way, in the embodiments of FIG. 1A, FIG. 2 and FIG. 3, by forming a protection device used for ESD on the same GaAs substrate as the portion of, for example, the high frequency integrated circuit and thereby providing an E field effect transistor type protection device requiring only a small number of additional steps in the production of a GaAs high frequency integrated circuit, having a high ESD protection capability, and very simple in structure, an excellent high frequency characteristic and high ESD withstand voltage which are conventionally difficult can both be obtained.

Table 1 shows the measurement results of ESD. As an ESD evaluation method, there are a machine model and a human body model. The machine model is a model of electrostatic stress generated when a mechanical device standardized in Electronic Industrial Society Standard EIA/JESD 22-A115-A etc. and charged with static electricity contacts a lead terminal etc. of the device.

Further, the human body model is standardized in for example the Electronic Industrial Society Standard EIA/JESD 22-A114 etc. and models the electrostatic stress generated when a human being charged with static electricity contacts a lead terminal etc. of the device.

The ESD evaluation device is configured by a charge circuit formed by serially connecting a variable voltage DC power source and a charging resistor, a charging capacitor, a switching switch provided between the charge circuit and a discharge circuit and selecting either one, and a discharge circuit in which charges stored in the charging capacitor are applied via the switch to a discharging resistor and a measured device (DUT).

For example, in the case of the human body model, values of the charging resistor, discharging resistor, and the charging capacitor of the ESD evaluation device are prescribed as 1 MΩ, 1.5 kΩ, and 100 pF.

Further, generally the measured device is measured in a state where it is detachably mounted on a socket etc.

In the evaluation method, the variable voltage DC power source is set at a measurement (charge) voltage and connected to the charging resistor side by switching the switch to charge the charging capacitor. Next, it is connected to the discharging resistor by switching the switch to apply charges stored in the charging capacitor via the discharging resistor to the measured device. Simultaneously with that, deterioration of the electrical characteristics of the measured device is checked. The voltage of the variable voltage DC power source is similarly measured by automatically changing the charge voltage by using a microcomputer etc. and processing is performed based on the obtained result to check the state of deterioration of the measured device along with the application voltage.

Below, the ESD intensities accompanying the existence of the protection device are compared. The high frequency integrated circuit without a protection device of the conventional example shown in FIG. 5 corresponds to the high frequency integrated circuit of the embodiment of FIG. 5 of the present invention and has a configuration not providing the E field effect transistor 25 for ESD protection. FIG. 6 shows an example using a diode type protection device. All of FIGS. 2, 5, and 6 show switch MMIC (microwave integrated circuits) using GaAs field effect transistors and show results obtained by performing an ESD breakdown strength test of MMIC in the machine model (conditions of 300 pF, 0Ω) and the human body charged model (conditions of 100 pF, 1500Ω).

Figure 5:
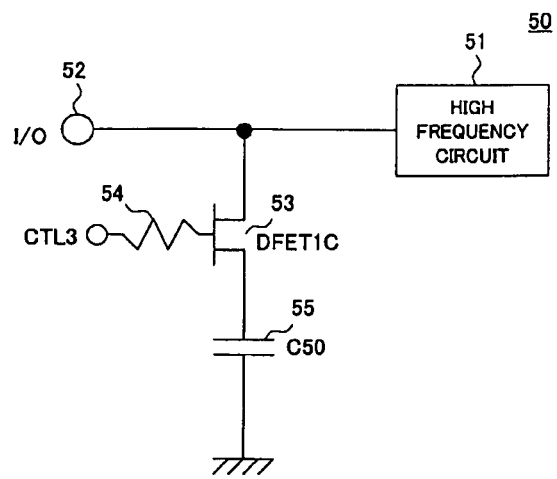
FIG. 5 is a circuit diagram showing an overall circuit configuration of a high frequency integrated circuit without an electrostatic protection device of a conventional example.
Figure 6:
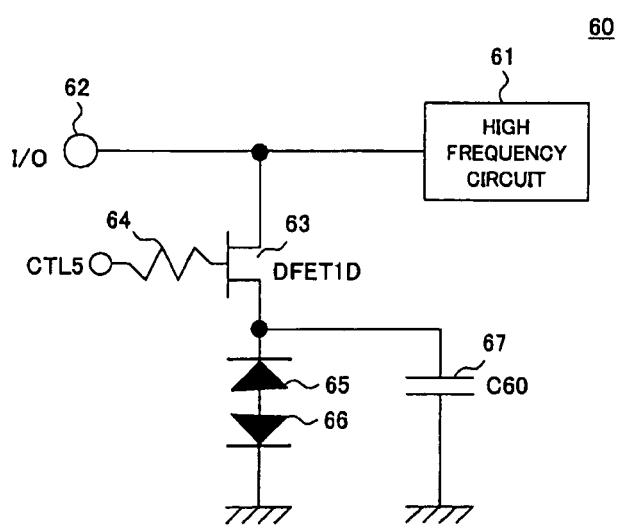
FIG. 6 is a circuit diagram showing an overall circuit configuration of a high frequency integrated circuit equipped with an electrostatic protection device using a plurality of diodes of a conventional example.

Table 1 shows the measurement results of the machine model and the human body model for FIG. 5 without a protection diode, FIG. 6 equipped with a protection diode, and FIG. 2 of the embodiment of a high frequency integrated circuit equipped with a field effect transistor protection device—all of the same configuration.

At the time of the machine model, the ESD intensity of the high frequency integrated circuit without a protection device shown in FIG. 5 is 150V, the ESD intensities of the high frequency integrated circuit equipped with a diode protection device shown in FIG. 6 are 200V and 250V, and the ESD intensity of the high frequency integrated circuit equipped with an E field effect transistor protection device shown in FIG. 3 is 300V.

Namely, results were obtained wherein the high frequency integrated circuit equipped with an E field effect transistor protection device had an ESD intensity about 2 times the ESD intensity of the circuit without a protection diode, and the ESD intensity was higher than the circuit equipped with a protection diode by 50 to 100V or more.

Further, at the time of the human body model, the ESD intensities of the high frequency integrated circuit without a protection device shown in FIG. 5 are 500V and 1000V, the ESD intensities of the high frequency integrated circuit equipped with a diode protection device shown in FIG. 6 are 1000V and 1500V, and ESD intensities of the high frequency integrated circuit equipped with an E field effect transistor protection device shown in FIG. 3 are 1500V and 2000V. As a result, the high frequency integrated circuit equipped with an E field effect transistor protection device has an ESD intensity about 2 to 3 times the ESD intensity of the high frequency integrated circuit without a protection diode. The result of a high ESD intensity about 1.5 times the ESD intensity of a high frequency integrated circuit equipped with a protection diode was obtained.

The circuit of FIG. 2 of the present invention clearly had a high ESD withstand voltage in comparison with the case of FIG. 6 of the diode protection device type and the case of FIG. 5 without a protection device. The superiority thereof could be confirmed.

TABLE 1

ESD intensity test results

|  | E field effect transistor type protection device, example of FIG. 2 | Without protection device, example of FIG. 5 | Diode type protection device, example of FIG. 6 |
|---|---|---|---|
| Machine model GND standard + application | 300 V | 150 V | 200 V |
| Machine model GND standard + application | 300 V | 150 V | 250 V |
| Human body model GND standard + application | 1500 V | 500 V | 1000 V |
| Human body model GND standard + application | 2000 V | 1000 V | 1500 V |

In this way, in the present high frequency integrated circuit, when providing an enhancement type field effect transistor at the input/output terminal of the high frequency integrated circuit and noise or a high voltage pulse is input from the outside, the enhancement type field effect transistor is made to perform a breakdown operation and its impedance is made low thereby to discharge the noise or high voltage pulse.

Even when using not only an enhancement type, but also a depletion type field effect transistor, the DC coupling capacitor of the high frequency circuit can be protected. Further, by combining these, the ESD intensity of the input or output of the high frequency circuit can be raised.

Further, by forming an enhancement type field effect transistor as the protection device on the same GaAs substrate as at least a portion of the high frequency circuit, the structure can be simplified. Further, also the parasitic capacitance can be made smaller in comparison with a junction diode protection device, therefore the ESD withstand voltage is improved and, at the same time, excellent high frequency characteristics can be maintained.

Industrial Capability

In the high frequency integrated circuit according to the present invention, an electrostatic device is provided at the input or output portion of a high frequency MMIC, and the electrostatic discharge (ESD) protection can be improved; therefore, the invention can be applied to the front end of a high frequency wireless communication apparatus.

The invention claimed is:
1. A high frequency integrated circuit comprising:
an enhancement type field effect transistor from the group consisting of an enhancement type high electron mobility transistor and an enhancement gate junction type field effect transistor;
a depletion type field effect transistor from the group consisting of a depletion type high electron mobility transistor and a depletion gate junction type field effect transistor;
a high frequency circuit on a GaAs compound semiconductor substrate, said enhancement type field effect tran- sistor and said depletion type field effect transistor being on said compound semiconductor substrate, wherein a terminal of a capacitor is directly electrically connected to a source of the enhancement type field effect transistor and a terminal of a resistor, another terminal of the resistor being directly electrically connected to a gate of the enhancement type field effect transistor, wherein an input/output terminal of the high frequency circuit is directly electrically connected to a drain of the depletion type field effect transistor, a gate of the depletion type field effect transistor being directly electrically connected to a terminal of a different resistor, wherein a source of the depletion type field effect transistor is directly electrically connected to another terminal of the capacitor and a drain of the enhancement type field effect transistor, said drain of the enhancement type field effect transistor being electrically connectable to said input/output terminal of the high frequency circuit, wherein an active device is within said high frequency circuit, a passive device being within said high frequency circuit.

2. A high frequency integrated circuit as set forth in claim 1, wherein said enhancement type field effect transistor is said enhancement type high electron mobility transistor, said depletion type field effect transistor being said depletion type high electron mobility transistor.

3. A high frequency integrated circuit as set forth in claim 1, wherein said enhancement type field effect transistor is said enhancement gate junction type field effect transistor, said depletion type field effect transistor being said depletion gate junction type field effect transistor.

4. A high frequency integrated circuit as set forth in claim 1, wherein said high frequency circuit is an RF device.

5. A high frequency integrated circuit as set forth in claim 1, wherein said high frequency circuit is an RF amplifier.

6. A high frequency integrated circuit as set forth in claim 1, wherein said high frequency circuit is an RF mixer.

7. A high frequency integrated circuit as set forth in claim 1, wherein said source of the enhancement type field effect transistor is directly electrically connected to a reference potential.

8. A high frequency integrated circuit as set forth in claim 1, wherein another terminal of the different resistor is configured to receive a control signal, said control signal controlling said depletion type field effect transistor to provide electrical connection and disconnection between said input/output terminal of the high frequency circuit and said drain of the enhancement type field effect transistor.

* * * * *